United States Patent
Mathew et al.

(10) Patent No.: US 9,570,105 B1
(45) Date of Patent: Feb. 14, 2017

(54) MAGNETIC RECORDING SYSTEM FOR REAL TIME AND RETRY MULTI-DIMENSIONAL SIGNAL EQUALIZATION

(71) Applicant: Avago Technologies General IP (Singapore) Pte. Ltd., Singapore (SG)

(72) Inventors: George Mathew, San Jose, CA (US); Jongseung Park, Allentown, PA (US); Han Fang, Shanghai (CN); Richard Rauschmayer, Longmont, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/967,591

(22) Filed: Dec. 14, 2015

(51) Int. Cl.
| | |
|---|---|
| G11B 5/035 | (2006.01) |
| G11B 20/10 | (2006.01) |
| H03H 21/00 | (2006.01) |
| G11B 5/09 | (2006.01) |
| H04L 25/03 | (2006.01) |
| H03G 5/00 | (2006.01) |

(52) U.S. Cl.
CPC ......... *G11B 20/10046* (2013.01); *G11B 5/035* (2013.01); *G11B 5/09* (2013.01); *G11B 20/10009* (2013.01); *H03G 5/005* (2013.01); *H03H 21/0012* (2013.01); *H04L 25/03038* (2013.01)

(58) Field of Classification Search
None
See application file for complete search history.

(56) References Cited

U.S. PATENT DOCUMENTS

| | | | |
|---|---|---|---|
| 7,978,797 B2 | 7/2011 | Marrow | |
| 8,139,301 B1* | 3/2012 | Li | G11B 5/012 360/39 |
| 8,797,666 B2* | 8/2014 | Xia | H04L 25/03171 360/39 |
| 9,047,205 B1 | 6/2015 | Chen | |
| 2012/0089657 A1* | 4/2012 | Yang | H04L 25/03993 708/323 |
| 2012/0105994 A1* | 5/2012 | Bellorado | G11B 5/012 360/45 |
| 2013/0208376 A1* | 8/2013 | Yang | G11B 20/10009 360/53 |
| 2013/0332790 A1* | 12/2013 | Lu | H03M 13/1111 714/752 |
| 2014/0129603 A1* | 5/2014 | Yang | H03H 17/0248 708/323 |

(Continued)

*Primary Examiner* — Tan X Dinh

(57) ABSTRACT

Systems and methods are disclosed for data processing, and more particularly for equalizing a data signal during both real time (i.e., on the fly) and retry operation. The system may include a first equalizer circuit operable to equalize a first sample set, and a second equalizer circuit operable to equalize a second sample set. The system may include a third equalizer circuit operable to equalize a summed data set to yield a third equalized output. The system may include a summation circuit connected to the first equalizer circuit, the second equalizer circuit, and a switch circuit. The summation circuit is operable to sum at least the first equalized data set and the second equalized data set to yield the summed data set. The switch circuit selectively provides the third equalized data set to the summation circuit.

19 Claims, 7 Drawing Sheets

(56) References Cited

U.S. PATENT DOCUMENTS

| | | | |
|---|---|---|---|
| 2014/0268390 A1* | 9/2014 | Lu | H04L 25/03025 360/32 |
| 2014/0286385 A1* | 9/2014 | Wilson | G11B 20/10046 375/232 |
| 2015/0113207 A1 | 4/2015 | Shin | |
| 2016/0163352 A1* | 6/2016 | Park | G11B 20/10472 360/45 |

* cited by examiner

MAGNETIC RECORDING SYSTEM FOR REAL TIME AND RETRY MULTI-DIMENSIONAL SIGNAL EQUALIZATION

FIELD OF THE INVENTIONS

Embodiments are related to systems and methods for data processing, and more particularly to systems and methods for equalizing a data signal during both real time (i.e., on the fly) and retry operation.

BACKGROUND

Various storage access systems have been developed that include an ability to sense data previously stored on a storage medium. Such storage access systems generally include circuitry and/or software used to process a sensed signal from a storage medium, and to process the sensed data in an attempt to recover an originally written data set that is difficult to recover. In some cases, two or more sensors are used to sense the same data, and the multiple streams of sensed data are combined into a unified data stream. In some cases, this process of generating a unified data stream is extended where a retry condition occurs. Such an extension is often costly in terms of one or both of area and latency.

Hence, for at least the aforementioned reasons, there exists a need in the art for advanced systems and methods for data processing.

SUMMARY

Embodiments are related to systems and methods for data processing, and more particularly to systems and methods for equalizing a data signal during both real time (i.e., on the fly) and retry operation.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present inventions may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
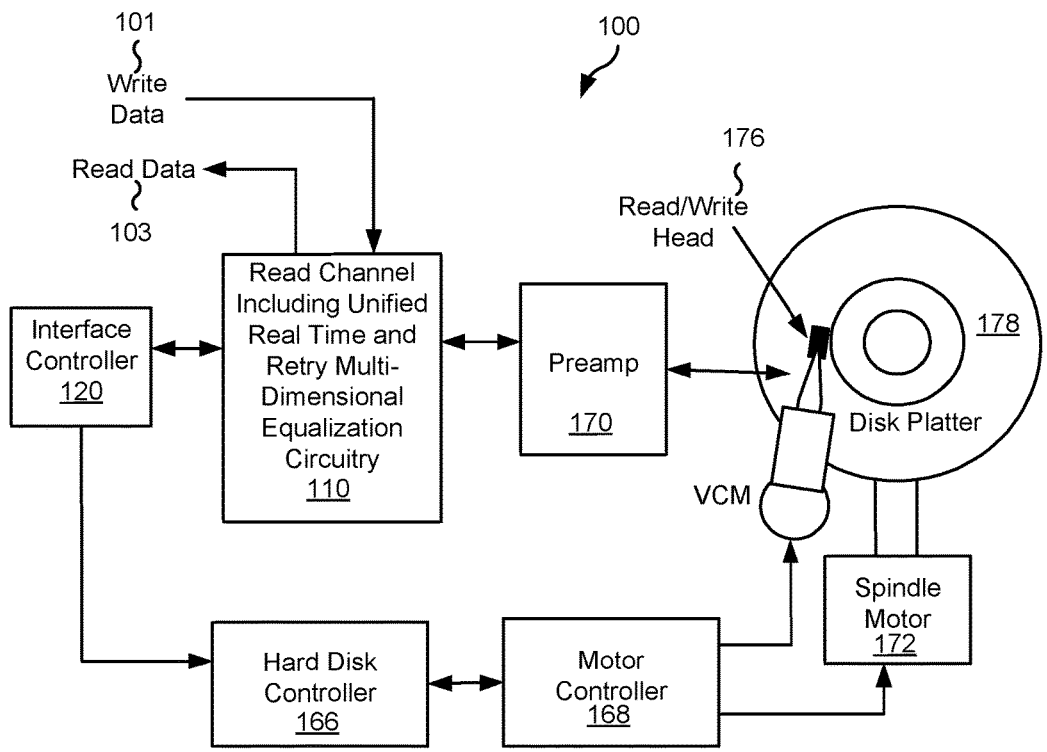
FIG. 1 shows a storage system including unified real time and retry multi-dimensional equalization circuitry in accordance with various embodiments of the present inventions.

Embodiments are related to systems and methods for data processing, and more particularly to systems and methods for equalizing a data signal during both real time (i.e., on the fly) and retry operation.

Various embodiments provide multi-dimensional equalizer systems that include: a first equalizer circuit operable to receive a first sample set derived from a first read sensor, and to equalize the first sample set to yield a first equalized data set; a second equalizer circuit operable to receive a second sample set derived from a second read sensor, and to equalize the second sample set to yield a second equalized data set; a third equalizer circuit operable to equalize a summed data set to yield a third equalized output; and a summation circuit connected to the first equalizer circuit, the second equalizer circuit, and a switch circuit. The summation circuit is operable to sum at least the first equalized data set and the second equalized data set to yield the summed data set. The switch circuit selectively provides the third equalized data set to the summation circuit. In some cases, the systems are implemented as part of an integrated circuit. In various cases, the systems are implemented as part of a data storage device.

In various instances of the aforementioned embodiments, the switch circuit causes a zero value to be presented to the summation circuit when an initial read of a data track of a storage medium is ongoing. In some instances, the switch circuit causes the third equalized output to be presented to the summation circuit when a retry read of a data track of a storage medium is ongoing. In some such instances, the summation circuit is operable to sum at least the first equalized data set, the second equalized data set, and the third equalized data set to yield the summed data set. In various instances, the switch circuit is a multiplexer circuit. In other instances, the switch circuit is a disable circuit operable to disable operation of the third equalizer circuit when an initial read of a data track of a storage medium is ongoing.

Other embodiments provide storage devices that include: a storage medium including at least one track; a read/write head assembly disposable in relation to the track on the storage medium, where the read/write head assembly includes at least a first read sensor and a second read sensor; and a read channel circuit. The read channel circuit includes: a first analog to digital converter circuit operable to convert a first analog signal derived from the first read sensor into a first series of digital samples; a second analog to digital converter circuit operable to convert a second analog signal derived from the second read sensor into a second series of digital samples; and a multi-dimensional equalizer system. The multi-dimensional equalizer system includes: a first equalizer circuit operable to receive the first series of digital samples, and to equalize the first series of digital samples to yield a first equalized output; a second equalizer circuit operable to receive the second series of digital samples, and to equalize the second series of digital samples to yield a second equalized output; a third equalizer circuit operable to equalize a summed output to yield a third equalized output; and a summation circuit connected to the first equalizer circuit, the second equalizer circuit, and a switch circuit. The summation circuit is operable to sum at least the first equalized output and the second equalized output to yield the summed output. The switch circuit selectively provides the third equalized output to the summation circuit.

Yet other embodiments provide methods for data processing that include: receiving a first data set; equalizing the first data set using a first equalizer circuit to yield a first equalized output; receiving a second data set; equalizing the second data set using a second equalizer circuit to yield a second equalized output; selectively summing only the first equalized output and the second equalized output to yield a first summed output during a first mode; and selectively summing the first equalized output, the second equalized output, and an equalized summed output derived from the first summed output to yield a second summed output during a second mode.

Turning to FIG. 1, a storage system 100 including a read channel circuit 110 having unified real time and retry multi-dimensional equalization circuitry is shown in accordance with various embodiments of the present inventions. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by multiple read sensors on read/write head assembly 176 as disk platter 178 is rotated by spindle motor 172. The resulting sensed magnetic signals derived from the read sensors are provided as a continuous, minute analog signals representative of the magnetic data on disk platter 178. These minute analog signals are transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signals to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During an initial read of data, the information from the respective sensors is unified using an equalization circuit that combines equalized sample sets each corresponding to a respective one of the read sensors. Where processing fails, a retry process may be triggered. The retry process includes the same unification of the information from the respective sensors along with a previously generated unified information set (e.g., a unified sample set generated during the initial read). The aforementioned unification process for both the initial read and a retry may be implemented using a multi-dimensional equalization circuit similar to that discussed below in relation to FIG. 3 and FIG. 5, and/or may operate consistent with the method discussed below in relation to FIG. 4. Such multi-dimensional equalization circuits may be implemented as part of a data processing circuit similar to those discussed below in relation to FIG. 2 and FIG. 6.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platter 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
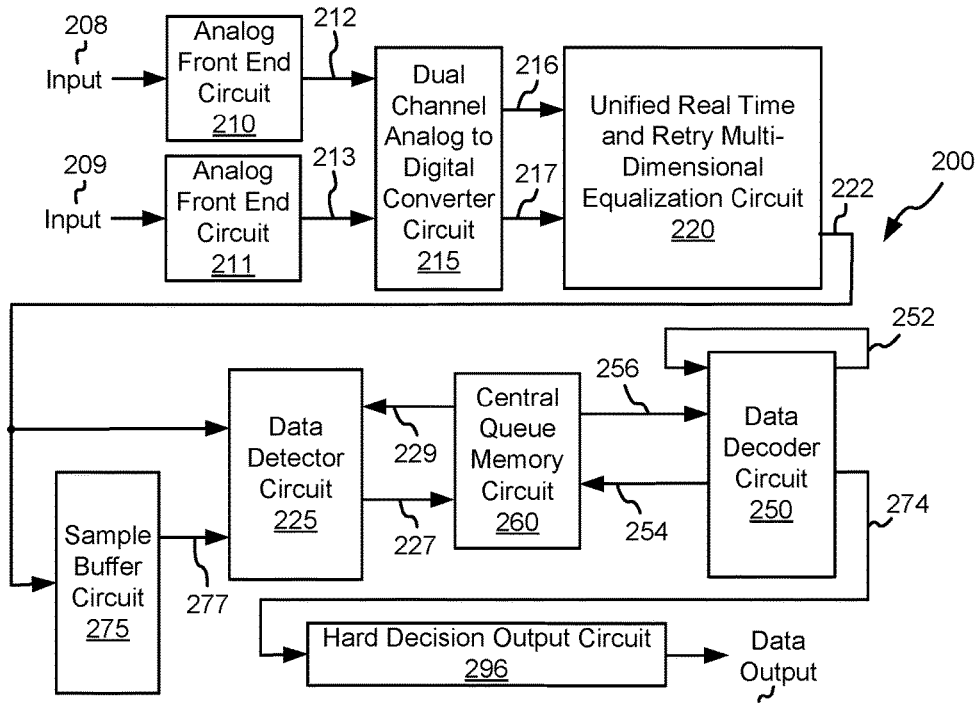
FIG. 2 shows a data processing circuit including a unified real time and retry multi-dimensional equalization circuit in accordance with some embodiments of the present inventions.

Turning to FIG. 2, a data processing circuit 200 is shown that includes unified real time and retry multi-dimensional equalization circuit 220 in accordance with some embodiments of the present inventions. Data processing circuit 200 includes an analog front end circuit 210 that receives an analog signal 208 derived from a first read sensor on a read/write head assembly. Analog front end circuit 210 processes analog signal 208 and provides a processed analog signal 212 to a dual channel analog to digital converter circuit 215. Analog front end circuit 210 may include, but is not limited to, an analog filter and an amplifier circuit as are known in the art. Based upon the disclosure provided herein, one of ordinary skill in the art will recognize a variety of circuitry that may be included as part of analog front end circuit 210. In addition, data processing circuit 200 includes an analog front end circuit 211 that receives an analog signal 209 derived from a second read sensor on the same read/write head assembly as the first read sensor. Analog front end circuit 211 processes analog signal 209 and provides a processed analog signal 213 to dual channel analog to digital converter circuit 215. Analog front end circuit 211 may include, but is not limited to, an analog filter and an amplifier circuit as are known in the art. Based upon the disclosure provided herein, one of ordinary skill in the art will recognize a variety of circuitry that may be included as part of analog front end circuit 211.

Dual channel analog to digital converter circuit 215 converts processed analog signal 212 into a corresponding series of digital samples 216, and similarly converts processed analog signal 213 into a corresponding series of digital samples 218. Dual channel analog to digital converter circuit 215 may be any circuit known in the art that is capable of producing digital samples corresponding to two different analog input signals. Based upon the disclosure provided herein, one of ordinary skill in the art will recognize a variety of analog to digital converter circuits that may be used in relation to different embodiments of the present inventions.

Digital samples 216 and digital samples 217 are provided to unified real time and retry multi-dimensional equalization circuit 220. Unified real time and retry multi-dimensional equalization circuit 220 applies two dimensional equalization to digital samples 217 and digital samples 216. During an initial read of data, the equalized data sets corresponding to each of digital samples 216 and digital samples 217 are summed together to yield an overall equalized output 222. In contrast, where processing of the initial read data fails, a retry process may be triggered which causes additional reads of the data from the storage medium. During the retry process, the equalized data sets corresponding to each of digital samples 216 and digital samples 217 and an equalized data set generated by applying an equalization algorithm to a previous instance of the overall equalized output 222 are summed together to yield an updated overall equalized output 222. Weights applied for generating each of the equalized data sets corresponding to respective ones of digital samples 216 and digital samples 217 and a previous instance of the overall equalized output 222 are adjusted by modifying coefficients used in the respective equalizer circuits in accordance with any joint two-dimensional equalization algorithm that are known in the art. In some embodiments, one or all of the equalized data sets are generated using one or more digital finite impulse response (DFIR) circuits. Based upon the disclosure provided herein, one of ordinary skill in the art will recognize a variety of approaches to modify the coefficients of these equalizer circuits using any 2-dimensional equalizer adaptation algorithm that may be used in relation to different embodiments of the present inventions.

Overall equalized output 222 is provided to both a data detector circuit 225 and a sample buffer circuit 275. Sample buffer circuit 275 includes sufficient memory to maintain one or more codewords until processing of that codeword is completed through data detector circuit 225 and a data decoder circuit 250 including, where warranted, multiple "global iterations" defined as passes through both data detector circuit 225 and data decoder circuit 250 and/or "local iterations" defined as passes through data decoding circuit 250 during a given global iteration. Sample buffer circuit 275 stores the received data as buffered data 277.

Data detector circuit 225 is a data detector circuit capable of producing a detected output 227 by applying a data detection algorithm to a data input. As some examples, the data detection algorithm may be but is not limited to, a Viterbi algorithm detection algorithm or a maximum a posteriori detection algorithm as are known in the art. Based upon the disclosure provided herein, one of ordinary skill in the art will recognize a variety of data detection algorithms that may be used in relation to different embodiments of the present inventions. Data detector circuit 225 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present inventions.

Detected output 227 is provided to a central queue memory circuit 260 that operates to buffer data passed between data detector circuit 225 and data decoder circuit 250. When data decoder circuit 250 is available, data decoder circuit 250 receives detected output 227 from central queue memory 260 as a decoder input 256. Data decoder circuit 250 applies a data decoding algorithm to decoder input 256 in an attempt to recover originally written data. The result of the data decoding algorithm is provided as a decoded output 254. Similar to detected output 227, decoded output 254 may include both hard decisions and soft decisions. For example, data decoder circuit 250 may be any data decoder circuit known in the art that is capable of applying a decoding algorithm to a received input. Data decoder circuit 250 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present inventions. Where the original data is recovered (i.e., the data decoding algorithm converges) or a timeout condition occurs, data decoder circuit 250 provides the result of the data decoding algorithm as a data output 274. Data output 274 is provided to a hard decision output circuit 296 where the data is reordered before providing a series of ordered data sets as a data output 298.

One or more iterations through the combination of data detector circuit 225 and data decoder circuit 250 may be made in an effort to converge on the originally written data set. As mentioned above, processing through both the data detector circuit and the data decoder circuit is referred to as a "global iteration". For the first global iteration, data detector circuit 225 applies the data detection algorithm without guidance from a decoded output. For subsequent global iterations, data detector circuit 225 applies the data detection algorithm to buffered data 277 as guided by decoded output 254. Decoded output 254 is received from central queue memory 260 as a detector input 229.

During each global iteration it is possible for data decoder circuit 250 to make one or more local iterations including application of the data decoding algorithm to decoder input 256. For the first local iteration (in the first global iteration), data decoder circuit 250 applies the data decoder algorithm without guidance from a decoded output 252. For subsequent local iterations, data decoder circuit 250 applies the data decoding algorithm to decoder input 256 as guided by a previous decoded output 252. In some embodiments of the present inventions, a default of ten local iterations is allowed for each global iteration.

Figure 3A:
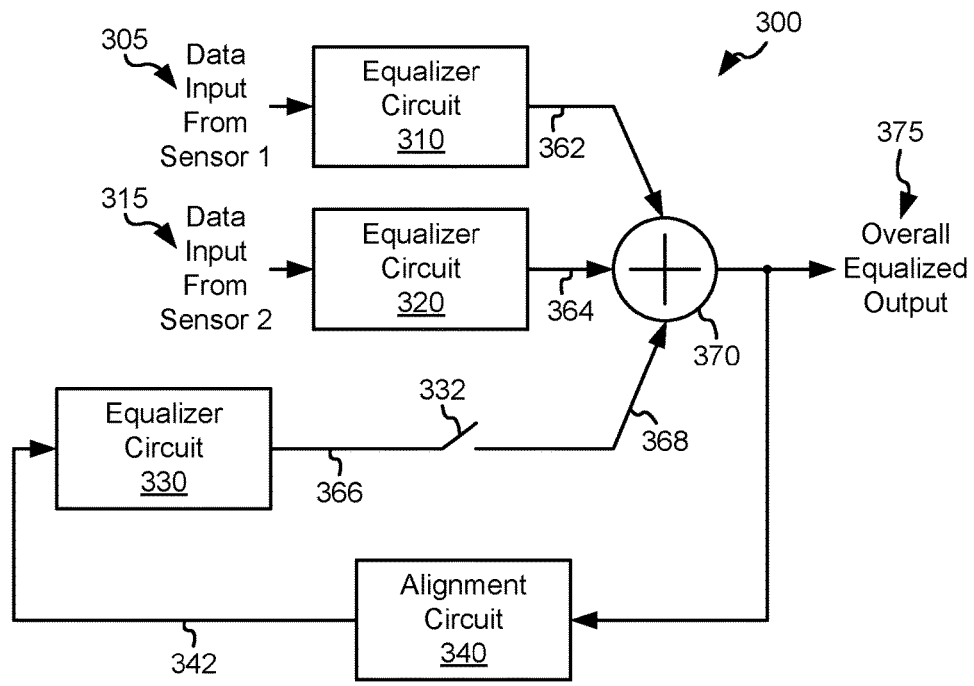
FIGS. 3a-3b shows one implementation of a unified real time and retry two-dimensional data equalization circuit in accordance with various embodiments of the present inventions.
Figure 3B:
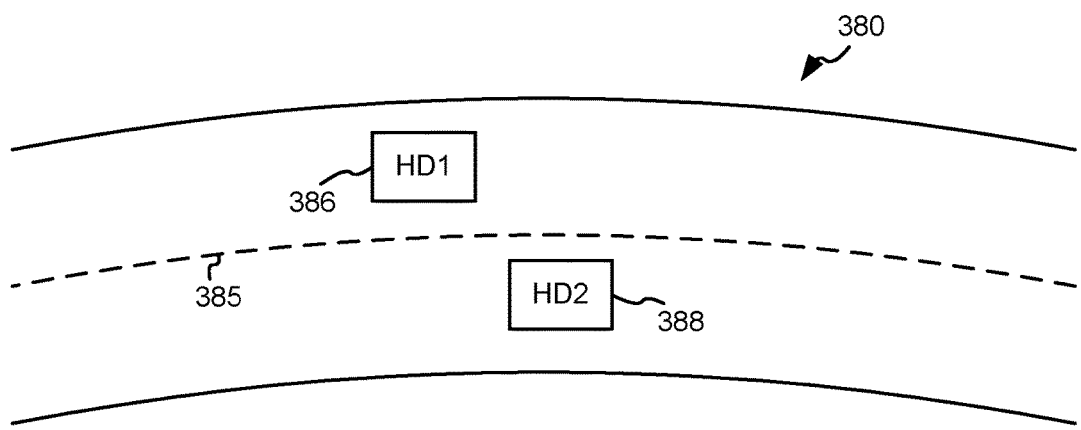

Turning to FIG. 3a, one implementation of a unified real time and retry two-dimensional data equalization circuit 300 is shown in accordance with various embodiments of the present inventions. Equalization circuit 300 includes an equalizer circuit 310 that applies an equalization to data input 305 to yield an interim equalized output 362. In some embodiments of the present inventions, the equalizer circuit 310 is a DFIR circuit. Data input 305 is derived from a first read sensor on a read/write head assembly. Additionally, equalization circuit 300 includes an equalizer circuit 320 that applies an equalization to data input 315 to yield an interim equalized output 364. In some embodiments of the present inventions, the equalizer circuit 320 is a DFIR circuit. Data input 315 is derived from a second read sensor on the same read/write head assembly as the first read sensor. Turning to FIG. 3b, a graphic 380 shows an example of a first read sensor 386 and a second read sensor 388 included in the same read/write head assembly (not shown) flying over a track of a storage medium where the center of the track is shown as a dashed line 385. In such a scenario both first read sensor 386 and second read sensor 388 are sensing data from the same track, albeit at different offsets from the center of the track.

Returning to FIG. 3a, during an initial read of the data from the track over which the first and second read sensors are disposed, a retry switch 332 is set such that a zero value is provided as an equalized input 368. Equalized input 368 is provided to a summation circuit 370 along with interim equalized output 362 and interim equalized output 364. Summation circuit 370 sums all of equalized input 368, interim equalized output 362, and interim equalized output 364 to yield an overall equalized output 375. A balance or weighting between the magnitude of interim equalized output 362 and interim equalized output 364 in the overall equalized output 375 is set based upon different sets of filter coefficients provided respectively to equalizer circuit 310 and equalizer circuit 320. Thus, in a non-retry mode, overall equalized output 375 is a weighted combination of data input 305 corresponding to the first read sensor and data input 315 corresponding to the second read sensor. Coefficients of equalizer circuits 310 and 320 may be determined using any 2-dimensional equalization algorithm known in the art.

The different sets of filter coefficients used to balance or weight the magnitudes of output 305 of first read sensor and output 315 of second read sensor may be adapted using any 2-dimensional equalizer adaptation algorithm known in the art for compensating for different offsets and/or signal quality derived from the different read sensors feeding the two dimensional equalizer formed by equalizer circuits 310 and 320. Retry switch 332 may be implemented using any switch technology known in the art. For example, in one embodiment retry switch 332 is implemented as a multiplexer circuit where a zero value is selected when a non-retry is ongoing, and an equalized output 366 is selected when a retry is ongoing. Alternatively, retry switch 332 may be implemented as a disable control circuit that disables the operation of the equalizer circuit 330 causing interim equalized output 366 to be zero. Based upon the disclosure provided herein, one of ordinary skill in the at will recognize a variety of implementations of retry switch 332 that may be used in relation to different embodiments of the present inventions.

Equalization circuit 300 additionally includes an alignment circuit 340 that aligns a previous instance of overall equalized output 375 (e.g., an instance of overall equalized output 375 calculated during a non-retry mode read or an instance of overall equalized output 375 calculated during a preceding retry read) with corresponding elements of data input 305 and data input 315. The elements of data input 305 and data input 315 are already aligned or synchronized by an upstream alignment circuit that is not shown. Upon aligning the previous instance of overall equalized output 375 with corresponding elements of data input 305 and data input 315, alignment circuit 340 provides the aligned result as an aligned feedback data 342. Aligned feedback data 342 are provided to equalizer circuit 330 which applies an equalization algorithm to yield interim equalized output 366. In some embodiments of the present inventions, equalizer circuit 330 is a DFIR circuit. The equalizer circuits 310, 320 and 330 jointly form a 2-dimensional equalizer circuit with three input data sets 305, 315 and 342, respectively, and the coefficients of the respective equalizer circuits 310, 320 and 330 may be adjusted using any 2-dimensional equalization algorithm known in the art. In some cases, alignment circuit 340 is a first-in/first-out memory and a read circuit that accesses the data from the first-in/first-out memory using a clock synchronized with the elements of the first and second data inputs 305, 315. Based upon the disclosure provided herein, one of ordinary skill in the art will recognize a variety of alignment circuits that may be used in relation to different embodiments of the present inventions.

During a retry operation triggered because of a failure of an initial read to correctly access the information from the track over which the first read sensor and second read sensor are disposed, retry switch 332 is set such that interim equalized output 366 is provided as equalized input 368. In such a configuration, summation circuit 370 sums all of interim equalized output 366 (provided as equalized input 368), interim equalized output 362, and interim equalized output 364 to yield overall equalized output 375. A balance or weighting between the magnitudes of interim equalized output 362, interim equalized output 364, and equalized output 366 is set based upon different sets of filter coefficients provided respectively to equalizer circuit 310, equalizer circuit 320, and equalizer circuit 330. Thus, in retry mode, overall equalized output 375 is a weighted combination of data input 305 corresponding to the first read sensor, data input 315 corresponding to the second read sensor, and aligned feedback data 342 corresponding to a previous instance of overall equalized output 375. The different sets of filter coefficients used to balance or weight the magnitudes of interim equalized output 362, interim equalized output 364 and interim equalized output 366 in the overall equalized output 375 may be adapted using any 2-dimensional equalizer adaptation algorithm known in the art for compensating for different offsets and/or signal quality derived from the different read sensors and previous instance of overall equalized output feeding equalizer circuits 310, 320 and 330, respectively.

Figure 4:
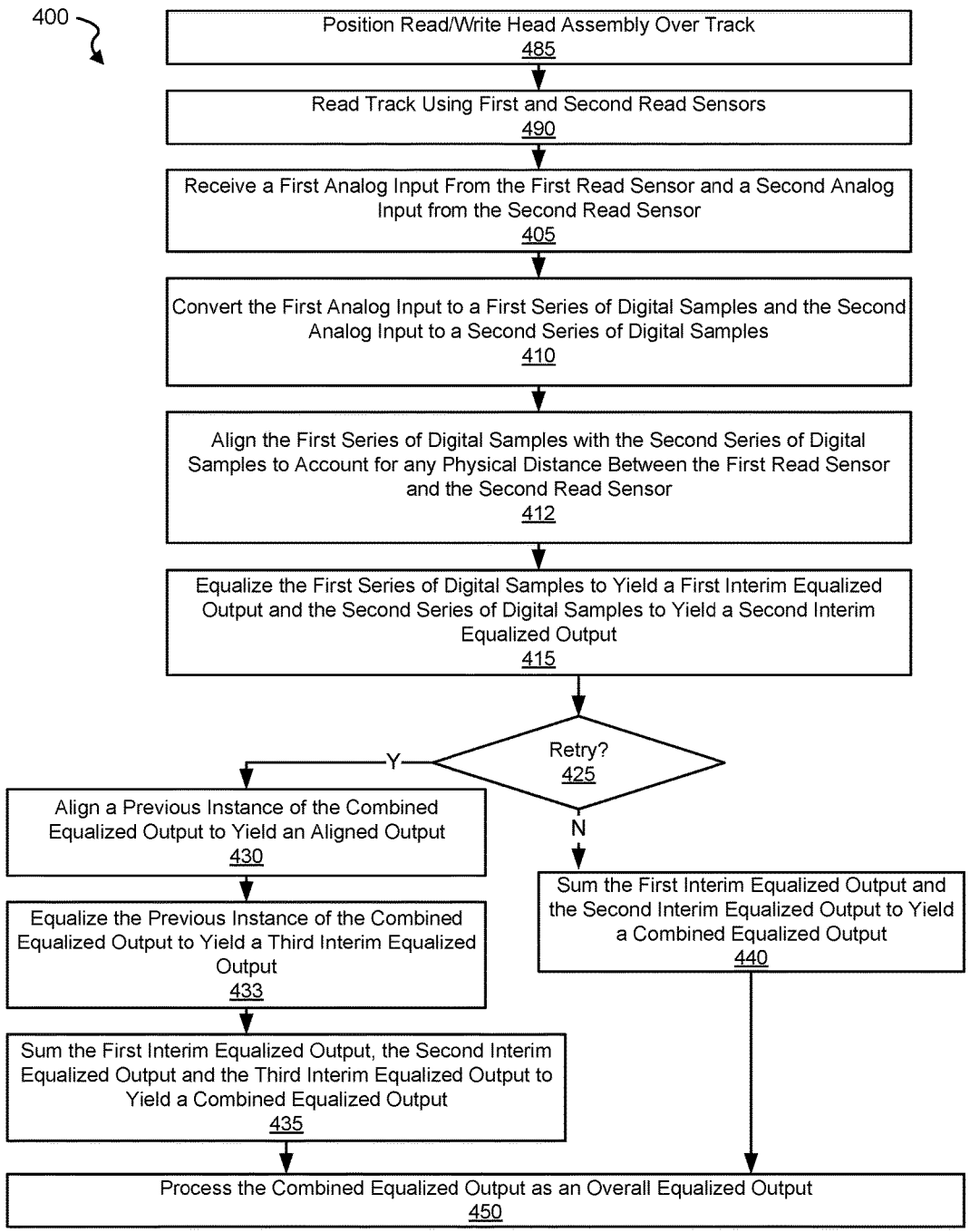
FIG. 4 is a flow diagram showing a method for unified real time and retry multi-dimensional data processing in accordance with some embodiments of the present inventions.

Turning to FIG. 4, a flow diagram 400 shows a method for unified real time and retry multi-dimensional data processing in accordance with some embodiments of the present inventions. Following flow diagram 400, a read/write head assembly is positioned over a track to be read (block 485). The read/write head assembly includes two or more read sensors that are disposed at different locations over the track. The track is then read as the read sensors fly over the track where each of the first sensor and second sensor sensing information on the track (block 490).

A first analog input is received from the first sensor, and a second analog input is received from the second sensor (block 405). The first analog input is processed including conversion to a first series of digital samples, and the second analog input is processed including conversion to a second series of digital samples (block 410). An alignment is performed to align the first series of digital samples with the second series of digital samples to account for any down-track physical separation between the first read sensor and the second read sensor on the read/write head assembly (block 412). An equalization algorithm is applied to the first series of digital samples to yield a first interim equalized output, and an equalization algorithm is applied to the second series of digital samples to yield a second interim equalized output (block 415).

It is determined whether a retry process is being performed (block 425). A retry process may be applied when an original read of data from a track failed to yield the correct data or when a previous retry process for the track failed to yield the correct data. Such a failure to yield the correct data may be determined, for example, based upon the failure of a data decoder to converge on a valid codeword. Based upon the disclosure provided herein, one of ordinary skill in the art will recognize a variety of failure conditions that may trigger a retry in accordance with different embodiments of the present inventions.

Where a retry process is not being performed (block 425), the first interim equalized output and the second interim equalized output are summed to yield a combined equalized output (block 440), and the combined equalized output is provided as an overall equalized output (block 450). Alternatively, where a retry process is being performed (block 425), a previous instance of the combined equalized output is aligned with corresponding elements in both the first interim equalized output and the second interim equalized output to yield an aligned output (block 430). An equalization algorithm is applied to the aligned version of the previous instance of combined equalized output to yield a third interim equalized output (block 433). The first interim equalized output, the second interim equalized output, and the third interim equalized output are summed to yield a combined equalized output (block 435), and the combined equalized output is provided as an overall equalized output (block 450).

Figure 5:
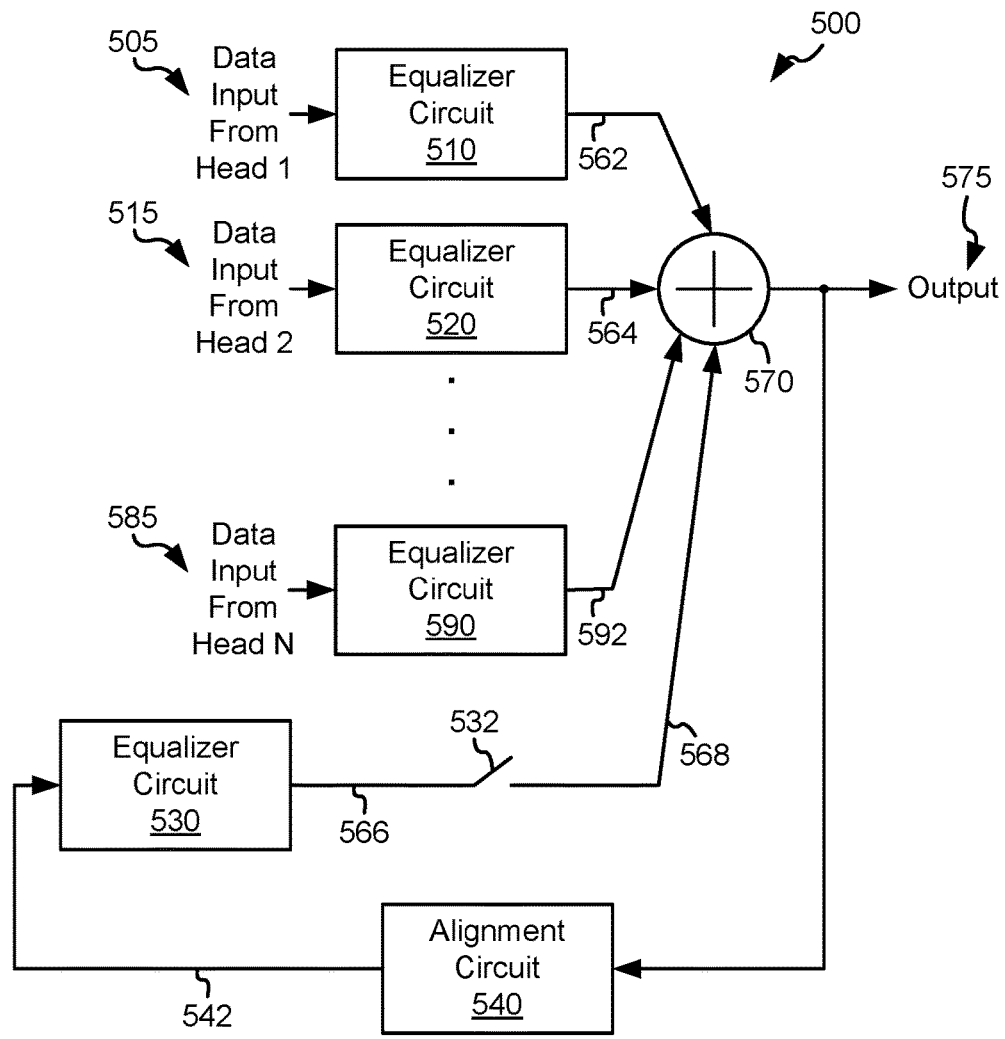
FIG. 5 shows another implementation of a unified real time and retry two-dimensional data equalization circuit with N-read sensors in accordance with one or more embodiments of the present inventions.

Turning to FIG. 5, another implementation of a unified real time and retry multi-dimensional data equalization circuit 500 is shown in accordance with one or more embodiments of the present inventions. Equalization circuit 500 includes an equalizer circuit 510 that applies an equalization to data input 505 to yield an interim equalized output 562. In some embodiments of the present inventions, equalizer circuit 510 is a DFIR circuit. Data input 505 is derived from a first read sensor on a read/write head assembly. Additionally, equalization circuit 500 includes an equalizer circuit 520 that applies an equalization to data input 515 to yield an interim equalized output 564. In some embodiments of the present inventions, equalizer circuit 520 is a DFIR circuit. Data input 515 is derived from a second read sensor on the same read/write head assembly as the first read sensor. Additionally, equalization circuit 500 includes an equalizer circuit 590 that applies equalization to data input 585 to yield an interim equalized output 592. In some embodiments of the present inventions, equalizer circuit 590 is a DFIR circuit. Data input 585 is derived from an Nth read sensor on the same read/write head assembly as the first read sensor. As indicated by the dots between equalizer circuit 520 and equalizer circuit 590, N indicates three or more equalizer circuits are included that apply equalization to a corresponding number of data inputs derived from respective read sensors. Coefficients of these equalizer circuits may be configured/adapted jointly using any 2-dimensional equalization algorithm known in the art. Similar to that shown above in relation to FIG. 3b, each of the N read sensors is disposed above a track on the storage medium. In such a scenario each of the N read sensors are sensing data from the same track, albeit at different offsets from the center of the track.

During an initial read of the data from the track over which the N read sensors are disposed, a retry switch 532 is set such that a zero value is provided as an equalized input 568. Equalized input 568 is provided to a summation circuit 570 along with interim equalized output 562, interim equalized output 564 and interim equalized output 592 (and other interim equalized outputs corresponding to other of the N data inputs). Summation circuit 570 sums all of equalized input 568 and all of the N interim equalized outputs to yield an overall equalized output 575. A balance or weighting between the magnitude of the N equalized outputs in the overall equalized output 575 is set based upon different sets of filter coefficients provided respectively to the N equalizer circuits. Thus, in a non-retry mode, overall equalized output 575 is a weighted combination of the N data inputs each corresponding to a respective one of the N read sensors.

The different sets of filter coefficients used to balance or weight the magnitudes of the N equalized outputs in the overall equalized output may be adapted using any 2-dimensional equalizer adaptation algorithm known in the art for compensating for different offsets and/or signal quality derived from the different read sensors feeding the N equalizer circuits. Retry switch 532 may be implemented using any switch technology known in the art. For example, in one embodiment retry switch 532 is implemented as a multiplexer circuit where a zero value is selected when a non-retry is ongoing, and interim equalized output 566 is selected when a retry is ongoing. Alternatively, retry switch 532 may be implemented as a disable control circuit that disables the operation of equalizer circuit 530 causing interim equalized output 566 to be zero. Based upon the disclosure provided herein, one of ordinary skill in the at will recognize a variety of implementations of retry switch 532 that may be used in relation to different embodiments of the present inventions.

Equalization circuit 500 additionally includes an alignment circuit 540 that aligns a previous instance of overall equalized output 575 (e.g., an instance of overall equalized output 575 calculated during a non-retry mode read or an instance of overall equalized output 575 calculated during a preceding retry read) with corresponding elements of the N data inputs. The elements of the N data inputs are already aligned or synchronized by an upstream alignment circuit that is not shown. Upon aligning the previous instance of overall equalized output 575 with corresponding elements of the N data inputs, alignment circuit 540 provides the aligned result as an aligned feedback data 542. Aligned feedback data 542 are provided to an equalizer circuit 530 which applies an equalization algorithm to yield interim equalized output 566. In some embodiments of the present inventions, equalizer circuit 530 is a DFIR circuit. In some cases, alignment circuit 540 is a first-in/first-out memory and a read circuit that accesses the data from the first-in/first-out memory using a clock synchronized with the elements of the N data inputs. Based upon the disclosure provided herein, one of ordinary skill in the art will recognize a variety of alignment circuits that may be used in relation to different embodiments of the present inventions.

In contrast, during a retry operation triggered because of a failure of an initial read to correctly access the information from the track over which the N read sensors are disposed, retry switch 532 is set such that interim equalized output 566 is provided as equalized input 568. In such a configuration, summation circuit 570 sums all of interim equalized output 566 (provided as equalized input 568) and the N interim equalized outputs to yield overall equalized output 575. A balance or weighting between the magnitude of interim equalized output 566 and the other N interim equalized outputs in the overall equalized output 575 is set based upon different sets of filter coefficients provided respectively to equalizer circuit 530 and the other N equalizer circuits. Thus, in retry mode, overall equalized output 575 is a weighted combination of aligned feedback data 542 corresponding to a previous instance of overall equalized output 575 and the other N data inputs corresponding to respective ones of the N read sensors. The different sets of filter coefficients used to balance or weight the magnitudes of interim equalized output 566 and the other N interim equalized outputs may be adapted using any 2-dimensional equalizer adaptation algorithm known in the art for compensating for different offsets and/or signal quality derived from the N read sensors.

Figure 6:
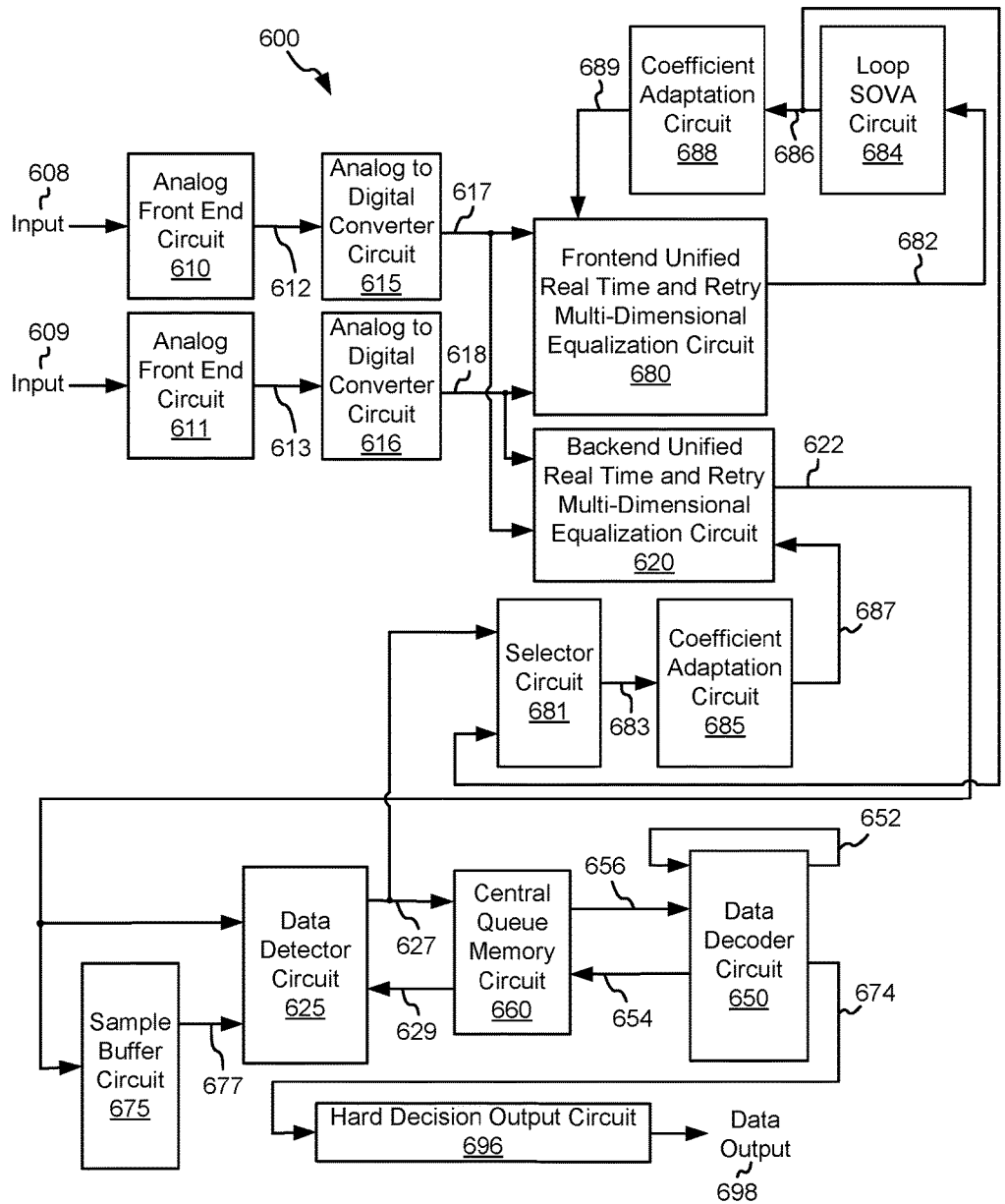
FIG. 6 shows a data processing circuit including both a frontend unified real time and retry multi-dimensional equalization circuit and a backend unified real time and retry multi-dimensional equalization circuit in accordance with one or more embodiments of the present inventions.

Turning to FIG. 6, a data processing circuit 600 is shown that includes both a frontend unified real time and retry multi-dimensional equalization circuit 680 and a backend unified real time and retry multi-dimensional equalization circuit 620 in accordance with one or more embodiments of the present inventions. Of note, data processing circuit 600 is shown with backend unified real time and retry multi-dimensional equalization circuit 620 and frontend unified real time and retry multi-dimensional equalization circuit 680 that are implemented using the same circuitry. In other embodiments, frontend unified real time and retry multi-dimensional equalization circuit 680 may be replaced by a more simple non-recursive equalizer circuit.

Data processing circuit 600 includes an analog front end circuit 610 that receives an analog signal 608 derived from a first read sensor on a read/write head assembly. Analog front end circuit 610 processes analog signal 608 and provides a processed analog signal 612 to an analog to digital converter circuit 615. Analog front end circuit 610 may include, but is not limited to, an analog filter and an amplifier circuit as are known in the art. Based upon the disclosure provided herein, one of ordinary skill in the art will recognize a variety of circuitry that may be included as part of analog front end circuit 610. In addition, data processing circuit 600 includes an analog front end circuit 611 that receives an analog signal 609 derived from a second read sensor on the same read/write head assembly as the first read sensor. Analog front end circuit 611 processes analog signal 609 and provides a processed analog signal 613 to an analog to digital converter circuit 616. Analog front end circuit 611 may include, but is not limited to, an analog filter and an amplifier circuit as are known in the art. Based upon the disclosure provided herein, one of ordinary skill in the art will recognize a variety of circuitry that may be included as part of analog front end circuit 611.

Analog to digital converter circuit 615 converts processed analog signal 612 into a corresponding series of digital samples 617. Similarly, analog to digital converter circuit 616 converts processed analog signal 613 into a corresponding series of digital samples 618. Analog to digital converter circuits 615, 616 may be any circuits known in the art that are capable of producing digital samples corresponding to an analog input signal. Based upon the disclosure provided herein, one of ordinary skill in the art will recognize a variety of analog to digital converter circuits that may be used in relation to different embodiments of the present inventions.

Digital samples 617 and digital samples 618 are provided to both backend unified real time and retry multi-dimensional equalization circuit 620 and frontend unified real time and retry multi-dimensional equalization circuit 680. Frontend unified real time and retry multi-dimensional equalization circuit 680 is used in relation to a control loops feedback circuit (e.g. timing loop, gain loop, DC loop etc), and backend unified real time and retry multi-dimensional equalization circuit 620 is used in relation to a data detecting/decoding circuit. Each of frontend unified real time and retry multi-dimensional equalization circuit 680 and backend unified real time and retry multi-dimensional equalization circuit 620 may be implemented similar to that discussed above in relation to FIG. 3. In some embodiments of the present invention, the frontend unified real time and retry multi-dimensional equalization circuit 680 may be replaced with only a real-time multi-dimensional equalization circuit (without option to combine overall equalized outputs from previous reads during retry) to save on hardware complexity and power consumption. In yet some embodiments of the present invention, the frontend unified real time and retry multi-dimensional equalization circuit 680 may be replaced with only a real-time multi-dimensional equalization circuit (without option to combine overall equalized outputs from previous reads during retry) while adaptation of the equalizer coefficients in the re-reads for a retry is done using detected output from the back-end detector.

The control loops feedback circuit includes a loop soft output Viterbi algorithm (SOVA) detector circuit 684 and a coefficient adaptation circuit 688. In operation, a Viterbi algorithm data detection is applied to a frontend overall equalized output 682 from frontend unified real time and retry multi-dimensional equalization circuit 680 to yield a frontend detected output 686. Frontend loop detected output 686 is provided to a coefficient adaptation circuit 688 that generates multiple coefficient sets 689 that each govern respective equalizer circuits included in frontend unified real time and retry multi-dimensional equalization circuit 680. Loop soft output Viterbi algorithm (SOVA) detector circuit 684 may be implemented consistent with any loop detector known in the art. Further, coefficient adaptation circuit 688 may be any circuit known in the art that is capable of adapting coefficients for multiple equalizer circuits making up a 2-dimensional equalizer for equalizing data generated from a track of a storage medium using multiple read sensors.

The data detecting/decoding circuit includes backend unified real time and retry multi-dimensional equalization circuit 620 that provides backend overall equalized output 622. Backend overall equalized output 622 is provided to both a data detector circuit 625 and a sample buffer circuit 675. Sample buffer circuit 675 includes sufficient memory to maintain one or more codewords until processing of that codeword is completed through data detector circuit 625 and a data decoder circuit 650 including, where warranted, multiple "global iterations" defined as passes through both data detector circuit 625 and data decoder circuit 650 and/or "local iterations" defined as passes through data decoding circuit 650 during a given global iteration. Sample buffer circuit 675 stores the received data as buffered data 677.

Data detector circuit 625 is a data detector circuit capable of producing a backend detected output 627 by applying a data detection algorithm to a data input. As some examples, the data detection algorithm may be but is not limited to, a Viterbi algorithm detection algorithm or a maximum a posteriori detection algorithm as are known in the art. Based upon the disclosure provided herein, one of ordinary skill in the art will recognize a variety of data detection algorithms that may be used in relation to different embodiments of the present inventions. Data detector circuit 625 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present inventions.

Backend detected output 627 is provided to a central queue memory circuit 660 that operates to buffer data passed between data detector circuit 625 and data decoder circuit 650. When data decoder circuit 650 is available, data decoder circuit 650 receives backend detected output 627 from central queue memory 660 as a decoder input 656. Data decoder circuit 650 applies a data decoding algorithm to decoder input 656 in an attempt to recover originally written data. The result of the data decoding algorithm is provided as a decoded output 654. Similar to backend detected output 627, decoded output 654 may include both hard decisions and soft decisions. For example, data decoder circuit 650 may be any data decoder circuit known in the art that is capable of applying a decoding algorithm to a received input. Data decoder circuit 650 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present inventions. Where the original data is recovered (i.e., the data decoding algorithm converges) or a timeout condition occurs, data decoder circuit 650 provides the result of the data decoding algorithm as a data output 674. Data output 674 is provided to a hard decision output circuit 696 where the data is reordered before providing a series of ordered data sets as a data output 698.

One or more iterations through the combination of data detector circuit 625 and data decoder circuit 650 may be made in an effort to converge on the originally written data set. As mentioned above, processing through both the data detector circuit and the data decoder circuit is referred to as a "global iteration". For the first global iteration, data detector circuit 625 applies the data detection algorithm without guidance from a decoded output. For subsequent global iterations, data detector circuit 625 applies the data detection algorithm to buffered data 677 as guided by decoded output 654. Decoded output 654 is received from central queue memory 660 as a detector input 629.

During each global iteration it is possible for data decoder circuit 650 to make one or more local iterations including application of the data decoding algorithm to decoder input 656. For the first local iteration (in the first global iteration), data decoder circuit 650 applies the data decoder algorithm without guidance from a decoded output 652. For subsequent local iterations, data decoder circuit 650 applies the data decoding algorithm to decoder input 656 as guided by a previous decoded output 652. In some embodiments of the present inventions, a default of ten local iterations is allowed for each global iteration.

Frontend detected output 686 and backend detected output 627 are provided to a selector circuit 681 that selects one of the inputs as a selected detected output 683. When an initial read of information from a track (i.e., a non-retry read mode) is being performed, selector circuit 681 selects frontend detected output 686 as selected detected output 683. In contrast, when a retry process is being performed, selector circuit 681 selects backend detected output 627 as selected detected output 683. Selected detected output 683 is provided to a coefficient adaptation circuit 685. Coefficient adaptation circuit 685 is implemented similar to coefficient adaptation circuit 688 and provides multiple coefficient sets 687 that each govern respective equalizer circuits included in backend unified real time and retry multi-dimensional equalization circuit 620.

Figure 7:
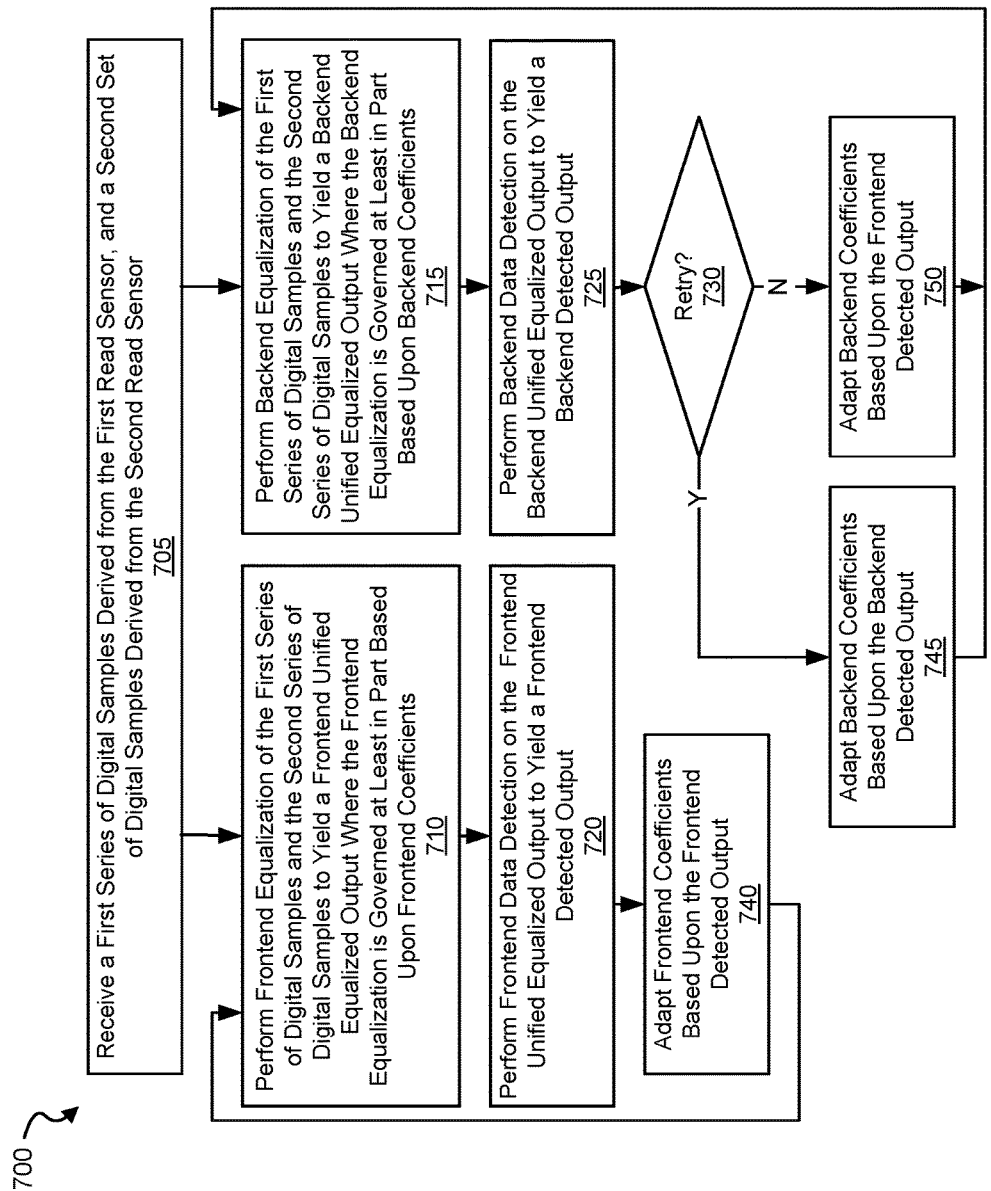
FIG. 7 is a flow diagram showing a method for adapting both a frontend multi-dimensional equalization circuit and a backend multi-dimensional equalization circuit in accordance with some embodiments of the present inventions.

Turning to FIG. 7, a flow diagram 700 shows a method for adapting both a frontend multi-dimensional equalization circuit and a backend multi-dimensional equalization circuit in accordance with some embodiments of the present inventions. Following flow diagram 700, a first series of digital samples derived from a first read sensor and a second series of digital samples derived from a second read sensor are received (block 705). A frontend equalization is applied to the combination of the first series of digital samples and the second series of digital samples to yield a frontend unified equalization output (block 710). In such a process the frontend equalization is governed at least in part based upon a frontend coefficients. A frontend data detection is applied to the frontend unified equalization output to yield a frontend detected output (block 720), and the frontend coefficients are adapted based upon the frontend detected output (block 740).

In parallel, a backend equalization is applied to the combination of the first series of digital samples and the second series of digital samples to yield a backend unified equalization output (block 715). Such backend equalization utilizes a re-equalization of a prior overall equalized output similar to that discussed above in relation to FIG. 4. In such a process the backend equalization is governed at least in part based upon a backend coefficients. A backend data detection is applied to the backend unified equalization output to yield a backend detected output (block 725). It is determined whether a retry process is ongoing (block 730). Where a retry process is ongoing (block 730), the backend coefficients are adapted based upon the backend detected output (block 745). Alternatively, where a retry process is not ongoing (block 730), the backend coefficients are adapted based upon the frontend detected output (block 750).

Figure 8:
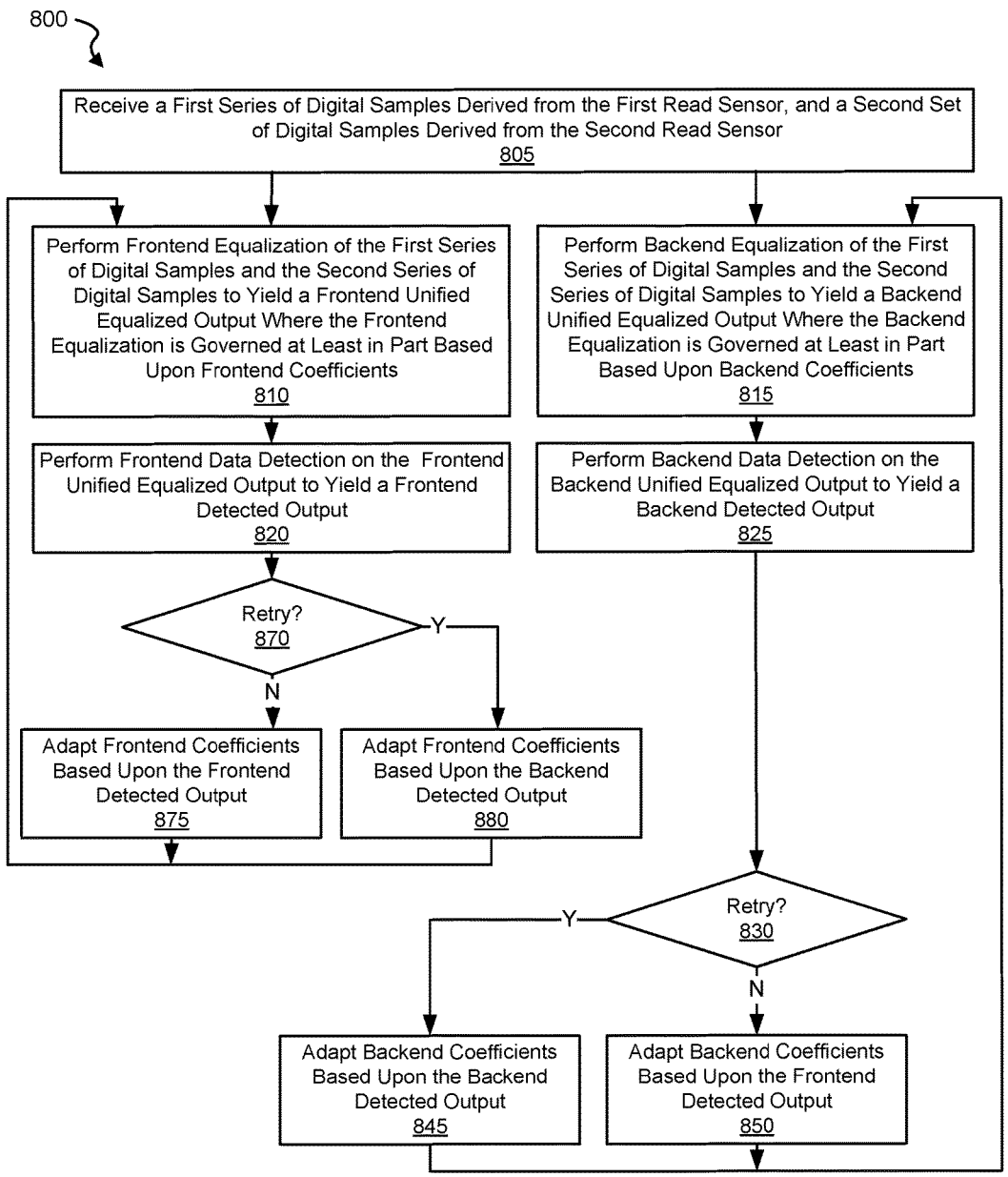
FIG. 8 is a flow diagram showing a method for adapting both a frontend multi-dimensional equalization circuit and a backend multi-dimensional equalization circuit in accordance with other embodiments of the present inventions.

Turning to FIG. 8, a flow diagram 800 shows a method for adapting both a frontend multi-dimensional equalization circuit and a backend multi-dimensional equalization circuit in accordance with some embodiments of the present inventions. In some cases, the frontend multi-dimensional equalization circuit is a simple non-recursive equalization circuit and the backend multi-dimensional equalization circuit is a selectively recursive equalization circuit similar to that discussed above in FIG. 3 and FIG. 5. Following flow diagram 800, a first series of digital samples derived from a first read sensor and a second series of digital samples derived from a second read sensor are received (block 805). A frontend equalization is applied to the combination of the first series of digital samples and the second series of digital samples to yield a frontend unified equalization output (block 810). In such a process the frontend equalization is governed at least in part based upon a frontend coefficients. A frontend data detection is applied to the frontend unified equalization output to yield a frontend detected output (block 820). It is determined whether a retry process is ongoing (i.e., data is being re-read from the storage medium) (block 870). Where a retry process is ongoing (block 870), the frontend coefficients are adapted based upon the backend detected output (block 880). This is done using the backend detected output generated from a previous data processing iteration. Alternatively, where a retry process is not ongoing (block 870), the frontend coefficients are adapted based upon the frontend detected output (block 875).

In parallel, a backend equalization is applied to the combination of the first series of digital samples and the second series of digital samples to yield a backend unified equalization output (block 815). Such backend equalization utilizes a re-equalization of a prior overall equalized output similar to that discussed above in relation to FIG. 4. In such a process the backend equalization is governed at least in part based upon a backend coefficients. A backend data detection is applied to the backend unified equalization output to yield a backend detected output (block 825). It is determined whether a retry process is ongoing (block 830). Where a retry process is ongoing (block 830), the backend coefficients are adapted based upon the backend detected output (block 845). Alternatively, where a retry process is not ongoing (block 830), the backend coefficients are adapted based upon the frontend detected output (block 850).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, functions of the systems or functions of the circuits discussed herein may be implemented in either software or firmware. In some such cases, the entire system, block or circuit may be implemented using its software or firmware equivalent, albeit such a software or firmware system would not be a circuit. In other cases, the one function of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A multi-dimensional equalizer system, the system comprising:
    a first equalizer circuit operable to receive a first sample set derived from a first read sensor, and to equalize the first sample set to yield a first equalized data set;
    a second equalizer circuit operable to receive a second sample set derived from a second read sensor, and to equalize the second sample set to yield a second equalized data set;
    a third equalizer circuit operable to equalize a summed data set to yield a third equalized output;
    a summation circuit connected to the first equalizer circuit, the second equalizer circuit, and a switch circuit, wherein the summation circuit is operable to sum at least the first equalized data set and the second equalized data set to yield the summed data set; and
    wherein the switch circuit is movable between a first state and a second state based on a mode of the multi-dimensional equalizer system to either prevent the third equalized data set from being provided to the summation circuit or cause the third equalized data set to be provided to the summation circuit.

2. The multi-dimensional equalizer system of claim 1, wherein the switch circuit in the first state causes a zero value to be presented to the summation circuit such that the summation circuit sums only the first equalized data set and the second equalized data set when an initial read of a data track of a storage medium is ongoing in a first mode.

3. The multi-dimensional equalizer system of claim 2, wherein the switch circuit in the second state causes the third equalized output to be presented to the summation circuit when a retry read of a data track of a storage medium is ongoing in a second mode.

4. The multi-dimensional equalizer system of claim 3, wherein the summation circuit is operable to sum at least the first equalized data set, the second equalized data set, and the third equalized data set to yield the summed data set in the second mode.

5. The multi-dimensional equalizer system of claim 1, wherein the switch circuit is a multiplexer circuit.

6. The multi-dimensional equalizer system of claim 1, wherein the switch circuit is a disable circuit operable to disable operation of the third equalizer circuit when an initial read of a data track of a storage medium is ongoing in a first mode.

7. The multi-dimensional equalizer system of claim 1, wherein the system is implemented as part of an integrated circuit.

8. The multi-dimensional equalizer system of claim 1, wherein the system is implemented as part of a data storage device.

9. A data storage device, the data storage device comprising:
a storage medium including at least one track;
a read/write head assembly disposable in relation to the track on the storage medium, wherein the read/write head assembly includes at least a first read sensor and a second read sensor; and
a read channel circuit including:
a first analog to digital converter circuit operable to convert a first analog signal derived from the first read sensor into a first series of digital samples;
a second analog to digital converter circuit operable to convert a second analog signal derived from the second read sensor into a second series of digital samples; and
a multi-dimensional equalizer system, the multi-dimensional equalizer system including:
a first equalizer circuit operable to receive the first series of digital samples, and to equalize the first series of digital samples to yield a first equalized output;
a second equalizer circuit operable to receive the second series of digital samples, and to equalize the second series of digital samples to yield a second equalized output;
a third equalizer circuit operable to equalize a summed output to yield a third equalized output; and
a summation circuit connected to the first equalizer circuit, the second equalizer circuit, and a switch circuit, wherein the summation circuit is operable to sum at least the first equalized output and the second equalized output to yield the summed output;
wherein the switch circuit selectively provides the third equalized output to the summation circuit,
wherein the multi-dimensional equalizer system is a first multi-dimensional equalizer system, wherein the summed output is a first summed output, wherein the first summed output is provided to a backend data detector circuit, wherein the backend data detector circuit is operable to apply a first data detection algorithm to the summed output to yield a first detected output, and wherein the data storage device further comprises:
a second multi-dimensional equalizer system operable to equalize a combination of at least the first series of digital samples and the second series of digital samples to yield a second summed output, and wherein the second summed output is provided to a frontend data detector circuit, wherein the frontend data detector circuit is operable to apply a second data detection algorithm to the summed output to yield a second detected output.

10. The data storage device of claim 9, wherein when the switch circuit is set to provide a zero value to the summation circuit, adaptation of coefficient sets governing operation of the first equalizer circuit and the second equalizer circuit is based upon the second detected output.

11. The data storage system of claim 9, wherein when the switch circuit is set to provide third equalized output to the summation circuit, adaptation of coefficient sets governing operation of the first equalizer circuit and the second equalizer circuit is based upon the first detected output.

12. The data storage device of claim 9, wherein the switch circuit causes a zero value to be presented to the summation circuit such that the summation circuit sums only the first equalized data set and the second equalized data set when an initial read of a data track of a storage medium is ongoing in a first mode.

13. The data storage device of claim 12, wherein the switch circuit causes the third equalized output to be presented to the summation circuit when a retry read of a data track of a storage medium is ongoing in a second mode.

14. The data storage device of claim 13, wherein the summation circuit is operable to sum at least the first equalized data set, the second equalized data set, and the third equalized data set to yield the summed data set in the second mode.

15. The data storage device of claim 9, wherein the switch circuit is one of a multiplexer circuit and a disable circuit operable to disable operation of the third equalizer circuit when an initial read of a data track of a storage medium is ongoing.

16. A method for data processing, the method comprising:
receiving a first data set;
equalizing the first data set using a first equalizer circuit to yield a first equalized output;
receiving a second data set;
equalizing the second data set using a second equalizer circuit to yield a second equalized output;
summing only the first equalized output and the second equalized output to yield a first summed output during a first mode; and
summing the first equalized output, the second equalized output, and an equalized summed output derived from the first summed output to yield a second summed output during a second mode.

17. The method of claim 16, wherein the first mode is a non-retry mode, and wherein the second mode is a retry mode.

18. The method of claim 16, the method further comprising:
equalizing the first summed output set using a third equalizer circuit to yield the equalized summed output.

19. The method of claim 18, wherein summing only the first equalized output and the second equalized output includes providing a zero value to a summation circuit, and wherein summing the first equalized output, the second equalized output, and an equalized summed output derived from the first summed output includes providing the equalized summed output to the summation circuit.

* * * * *